United States Patent [19]
Fairgrieve

[11] Patent Number: 5,874,865
[45] Date of Patent: Feb. 23, 1999

[54] CONSTANT AMPLITUDE VS. FREQUENCY OSCILLATOR

[75] Inventor: Alexander Fairgrieve, Menlo Park, Calif.

[73] Assignee: Elantec Semiconductor, Inc., Milpitas, Calif.

[21] Appl. No.: 854,517

[22] Filed: May 12, 1997

[51] Int. Cl.$^6$ ........................................... H03B 5/00
[52] U.S. Cl. ........................................... 331/75; 331/177 R
[58] Field of Search ........................... 331/34, 45, 74, 331/75, 177 R, 182, 183; 330/132, 137, 285; 327/165; 455/232.1, 235.1

[56] References Cited

U.S. PATENT DOCUMENTS

| | | | |
|---|---|---|---|
| 4,568,888 | 2/1986 | Kimura et al. | 331/10 |
| 4,743,867 | 5/1988 | Smith | 331/16 X |
| 5,512,861 | 4/1996 | Sharma | 331/74 |

*Primary Examiner*—David Mis
*Attorney, Agent, or Firm*—Fliesler, Dubb, Meyer & Lovejoy

[57] ABSTRACT

A variable frequency oscillator providing a constant amplitude with variations in frequency. The variable frequency oscillator includes: an oscillator having an input connected for receiving a current $I_1$, and outputs for providing complementary signals having a frequency varying in proportion to the current $I_1$; first and second transistors, each having a base connected to a respective one of the oscillator outputs; current supply circuitry having a first output connected to the input of the oscillator for providing the current $I_1$, and a second output connected to the emitters of the first and second transistors for providing a current $I_3$, the current $I_3$ varying in proportion to the current $I_1$, without varying significantly due to changes in the oscillator frequency; and first and second output amplifiers, each having an input connected to the collector of a respective one of the first and second transistors, and an output for providing a signal which varies in proportion to the current $I_3$ and varies inversely proportion to the oscillator frequency. With such circuitry, variations in amplitude of signals driving the output amplifiers due to changes in oscillator frequency will cancel inverse variations in amplitude of signals at the outputs of the output amplifiers due to the changes in the oscillator frequency.

8 Claims, 2 Drawing Sheets

CONSTANT AMPLITUDE VS. FREQUENCY OSCILLATOR

BACKGROUND OF THE INVENTION

1. Field of the Invention

The present invention relates to variable frequency oscillators. More particularly, the present invention relates to controlling amplitude of a signal from an amplifier providing the output of the variable frequency oscillator as oscillator frequency increases when the amplifier is operating near its process limits where amplifier gain decreases significantly with increasing oscillator frequency.

2. Description of the Related Art

With variable frequency oscillators, and particularly variable frequency oscillators using integrated circuit components, output amplitude will typically vary significantly with frequency over at least a portion of the frequency operation range. Output signal amplitude will vary due to factors such as slew rate, transconductance (gm), temperature, and power supply voltage. Typically a goal is to maintain constant amplitude with all these factors.

For digital applications, a variable frequency oscillator typically serves as a clock signal source so that the output of its oscillator will be amplified, but then limited to obtain a square wave signal. The amplification in such digital applications is regarded as nonlinear amplification, because the limiting enables variations in frequency to occur without changes in amplitude.

For analog applications, oscillators are also utilized, but precise linear amplification is needed, unlike with digital applications. Such linear amplification, however, is difficult to control against the significant number of factors mentioned above when frequency is varied, particularly when the oscillator frequency approaches its limits due to limitations in integrated circuit process technology.

When the oscillator in a variable frequency oscillator is approaching its frequency limits due to limitations in integrated circuit technology, it is almost certain that the amplifier used to output a signal from the variable frequency oscillator is also near its operation limits. In other words, the operating frequency of the amplifier will be beyond its dominant pole as shown by the "region of operation" in FIG. 1, which plots typical amplifier gain vs. frequency. With amplifier operation beyond a dominant pole, as shown in FIG. 1, the amplifier gain will typically change in proportion to 1/f due to factors mentioned above, where f denotes frequency of a signal input to the amplifier. Thus, with a variable frequency oscillator using an amplifier operating beyond its dominant pole, output signal amplitude can vary significantly with frequency, contrary to operating conditions typically desired for analog applications.

SUMMARY OF THE INVENTION

The present invention includes a variable frequency oscillator with an output signal amplitude which does not vary with changes in frequency when the amplifier providing the output signal of the variable frequency oscillator is operating beyond its dominant pole.

The variable frequency oscillator of the present invention includes:

an oscillator having an input connected for receiving a current $I_1$, and outputs for providing complementary signals having a frequency varying in proportion to the current $I_1$;

first and second transistors each having a base connected to a respective one of the oscillator outputs;

current supply circuitry having a first output connected to the input of the oscillator for providing the current $I_1$, and a second output connected to the emitters of the first and second transistors for providing a current $I_3$, the current $I_3$ varying in proportion to the current $I_1$, without varying due to changes in the oscillator frequency; and first and second output amplifiers, each having an input connected to the collector of a respective one of the first and second transistors, and an output for providing a signal which varies in proportion to the current $I_3$ and varies inversely proportion to the oscillator frequency.

The output of the variable frequency oscillator may be taken either single ended, or differentially from the outputs of the output amplifiers. Further, the output amplifiers may be either current or voltage amplifiers. An amplifier operating past its dominant pole as shown in FIG. 1 can be used to provide the output amplifiers because the amplifier output will vary inversely with changes in frequency.

With circuitry for a variable frequency oscillator of the present invention as described, variations in amplitude of signals driving the output amplifiers due to changes in oscillator frequency will be cancel inverse variations in amplitude at the outputs of the output amplifiers due to the changes in the oscillator frequency. Thus, the variable frequency oscillator of the present invention can provide a substantially constant output amplitude with variations in frequency.

BRIEF DESCRIPTION OF THE DRAWINGS

Further details of the present invention are explained with the help of the attached drawings in which.

DETAILED DESCRIPTION

Figure 2:
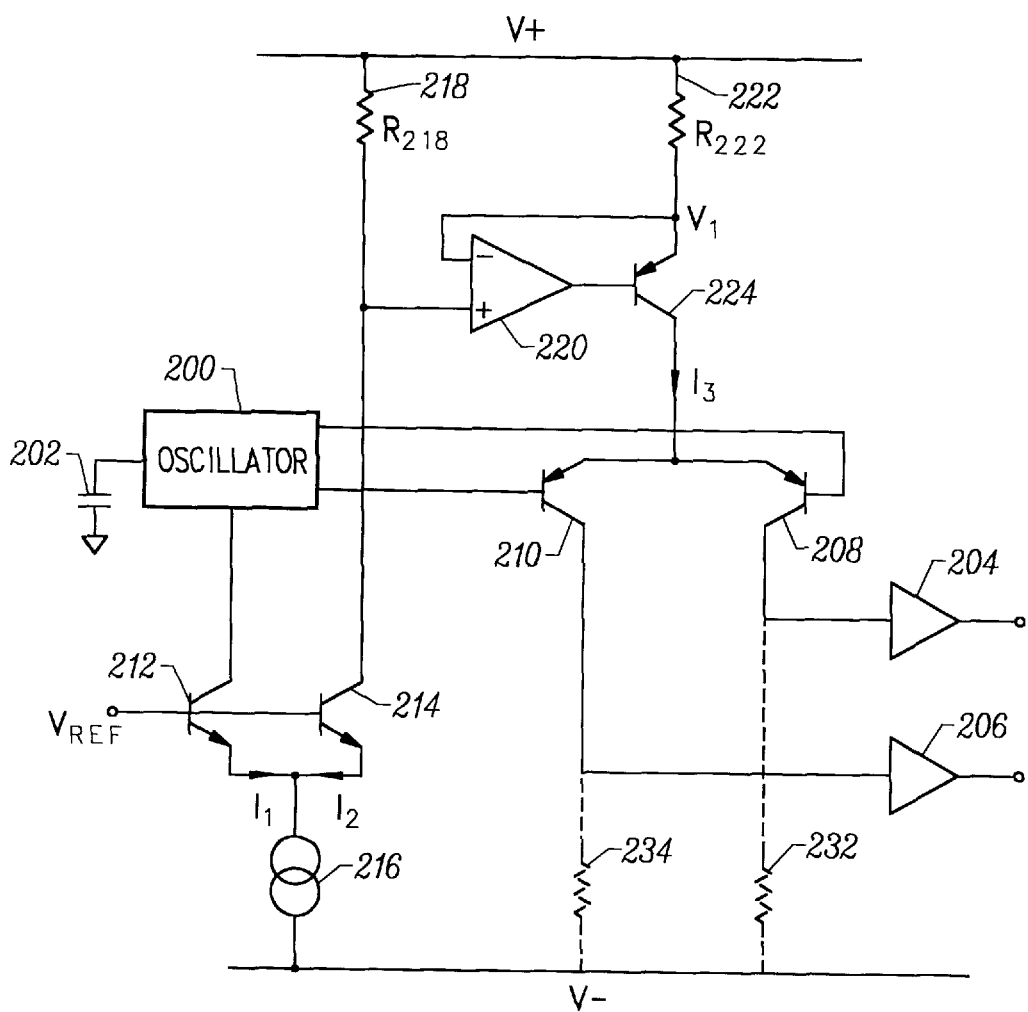
FIG. 2 shows a variable frequency oscillator of the present invention.

FIG. 2 shows a variable frequency oscillator of the present invention. The circuitry of FIG. 2 includes an oscillator 200 having circuitry which operates to charge a capacitor 202. The oscillator 200 provides complementary output signals, each having a frequency proportional to I, where I, denotes the bias current driving the oscillator 200 which is switched in and out of the capacitor 202. The frequency of the output signal from oscillator 200, f, can then be expressed as $f=K_1 \cdot I_1$, where $K_1$ is a constant depending on the capacitance 202 and the overall design of circuitry in the oscillator.

Figure 1:
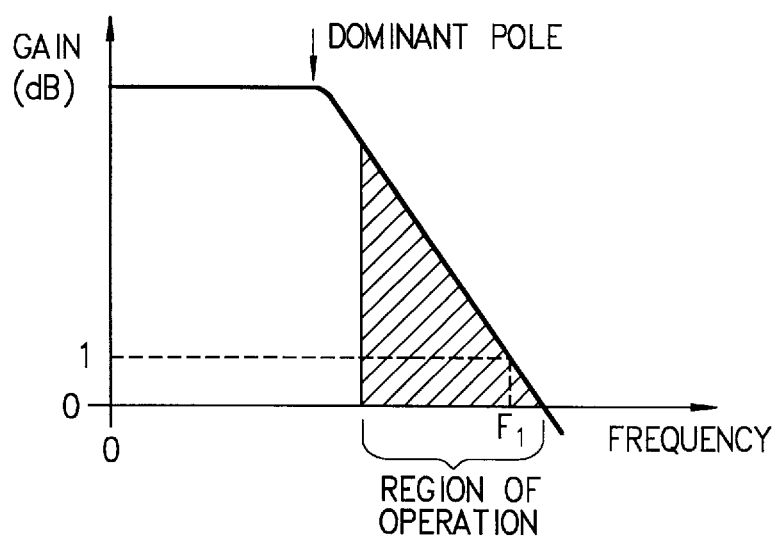
FIG. 1 plots frequency vs. gain for an amplifier.

The circuitry of FIG. 2 further includes amplifiers 204 and 206 which operate with a gain proportional to 1/f, where f denotes the frequency of the signal input to the amplifiers as provided by oscillator 200. As such, amplifiers 204 and 206 may be amplifiers operating beyond a dominant pole as denoted by in the "region of operation" shown in FIG. 1, where amplifier gain will typically be proportional to 1/f.

In addition to the oscillator 200 and amplifiers 204 and 206, the circuit of the present invention provides control circuitry driving amplifiers 204 and 206 operating such that as the oscillator 200 frequency is changed, amplitude changes in signals from the amplifiers 204 and 206 due to changes in oscillator frequency will be canceled.

As shown in FIG. 2, such control circuitry can include a current splitter made up of transistors 212 and 214 having emitters connected to a current sink 216. Transistor 212 provides a current $I_1$ through its collector to emitter path, while transistor 214 provides a current $I_2$ through its collector to emitter path. Bases of transistors 212 and 214 are connected to a voltage reference $V_{REF}$ which may be varied to control the operation frequency of the variable frequency oscillator of FIG. 2. As configured, the current $I_2$ can be expressed as $I_2=K_2 \cdot I_1$, where $K_2$ is the ratio of the emitter sizes of transistors 212 and 214.

The collector of transistor 212 is connected to the input of oscillator 200 to provide the signal $I_1$, to drive oscillator 200 without causing either $I_1$, or $I_2$ to vary with changes in the frequency of oscillator 200. The collector of transistor 214 is connected to the first terminal of a resistor 218 having a resistance $R_{218}$, and the noninverting input of a unity gain operational amplifier 220. A second terminal of resistor 218 is connected to a power supply voltage V+. The operational amplifier 220 has an output connected to the base of a transistor 224, and an inverting input connected to the emitter of transistor 224. The combination of the amplifier 220 and transistor 224 form a simple transconductance amplifier having a property such that $V_1$ at the inverting input of amplifier 220 will have a value $V_1=I_2 \cdot R_{218}$.

A resistor 222 having a resistance $R_{222}$ connects the emitter of transistor 224 to the power supply voltage V+. As such, a current $I_3$ provided from the collector of transistor 224 will have the characteristic $I_3=V_1/R_{222}$.

The collector of transistor 224 is connected to the emitter of transistors 208 and 210. The bases of transistors 208 and 210 are driven by respective complementary outputs of the oscillator 200. The amplitude of signals output from the oscillator 200 to transistors 208 and 210 is not critical, as long as it is sufficient to fully switch transistors 208 and 210. The collectors of transistors 208 and 210 are connected to the inputs of respective amplifiers 204 and 206. Transistors 208 and 210, thus, serve to switch the current $_3$ from the collector of transistor 224 into amplifiers 204 and 206.

Amplifiers 204 and 206 may be either current or voltage amplifiers. If amplifiers 204 and 206 are voltage amplifiers, a voltage can be provided to the input of the amplifiers by including resistors 232 and 234 which are shown in dashed lines. Resistor 232 will connect the input of amplifier 204 to the voltage supply V−, while resistor 234 will connect the input of amplifier 206 to the voltage supply V−. If amplifiers 204 and 208 are current amplifiers, resistors 232 and 234 are not used.

The output from the variable frequency oscillator of FIG. 2 can be taken differentially from the outputs of amplifiers 204 and 206. The output of the circuit of FIG. 2 can also be taken single ended from the output of only one of amplifiers 204 and 206.

To describe operation for the circuit of FIG. 2, for convenience it is assumed that the output from the variable frequency oscillator is taken single ended from amplifier 204. Further it is assumed that amplifier 204 has a gain dropping to 1 at $f=F_1$, so that output signal amplitude, Vout, for the amplifier 204 after amplification will be expressed as Vout=Vin·($F_1$/f). Similarly, if amplifier 204 is operating as a current amplifier operating with gain dropping to 1 at $f=F_1$, output signal amplitude, Iout, after amplification can be expressed as Iout=Iin·($F_1$/f). For convenience it will also be assumed that "output" is the output from amplifier 204 which is a current amplifier. The output of amplifier 204 can, thus, be expressed as follows:

$$\text{Output} = I_3 \cdot F_1 / f \qquad (1)$$

The output of oscillator 200 driving transistor 208 will have the frequency $f=K_1 \cdot I_1$, as indicated above, so combining this equation with equation 1, output can be reexpressed as follows:

$$\text{Output} = (I_3 \cdot F_1)/(K_1 \cdot I_1) \qquad (2)$$

The current $I_3$ can be expressed in terms of the voltage $V_1$, as indicated above, as $I_3=V_1 R_{222}$. Combining this equation with equation 2, output can be reexpressed as follows:

$$\text{Output} = (V_1 \cdot F_1)/(K_1 \cdot I_1 \cdot R_{222}) \qquad (3)$$

The voltage $V_1$ can be expressed in terms of the current $I_2$, as indicated previously, as $V_1=I_2 R_{218}$. Combining this equation with equation 3, output can be reexpressed as follows:

$$\text{Output} = (I_2 \cdot R_{218} \cdot F_1)/(K_1 \cdot R_{222}) \qquad (4)$$

The current $I_2$ is a fixed ratio of $I_1$ such that $I_2=K_2 \cdot I_1$, as indicated previously. Combining this equation with equation 4, output can further be reexpressed, enabling the term $I_1$, to be eliminated as follows:

$$\begin{aligned}\text{Output} &= (K_2 \cdot I_1 \cdot R_{218} \cdot F_1)/(K_1 \cdot I_1 \cdot R_1) \\ &= (K_2 \cdot R_{218} \cdot F_1)/(K_1 \cdot R_{222})\end{aligned} \qquad (5)$$

With the term $I_1$ eliminated, $I_1$, varying with frequency changes, the output of amplifier 204 is only dependent on the terms $F_1$, $K_1$, $K_2$, $R_{218}$ and $R_{222}$ which all remain constant with frequency. Thus, using the circuit of FIG. 2 it is possible to change the frequency of oscillator 200 without the final output amplitude being changed, even though the gain of amplifiers 204 and 206 are falling at −20 dB per decade of frequency.

Although operation is described with the output taken single ended where amplifiers 204 and 206 are current amplifiers, operation will similarly occur where amplitude remains constant with frequency variations when the circuit of FIG. 2 provides differential outputs, or where amplifiers 204 and 206 operate as voltage amplifiers. As long as a current proportional to the current driving the oscillator 200 is also used to adjust the signal which is amplified in FIG. 2, the output signal amplitude of the variable frequency oscillator will be independent of frequency. The amplitude at the output of the variable frequency oscillator of FIG. 2 can be set by setting the values of resistors 218 and 222. If the circuit of FIG. 2 is designed to operate over many octaves, varying resistor 222 to set the desired amplitude makes circuit design simple since the voltage at $V_1$ depends on the selected frequency only.

In conclusion, the present invention provides a new variable frequency oscillator architecture which enables independent control of frequency and amplitude for a given integrated circuit manufacturing process wherein the amplifiers of the variable frequency oscillator are operating well beyond their dominant poles. Such a variable frequency oscillator will be beneficial for use in driving analog devices which typically cannot resort to the nonlinear amplification commonly used in driving digital devices.

Although the invention has been described above with particularity, this was merely to teach one of ordinary skill in the art how to make and use the invention. Many modifications will fall within the scope of the invention, as that scope is defined by the claims which follow.

What is claimed is:

1. A variable frequency oscillator comprising:
   an oscillator having an input connected for receiving a first current, and an output for providing a signal having a frequency varying in proportion to the first current;
   current supply circuitry having a first output connected to the input of the oscillator for providing the first current, and a second output providing a second current, the first current having an amplitude varying in proportion to an amplitude of the second current;

a first transistor having a base connected to the output of the oscillator, and a collector to emitter path connected on a first end to the second output of the current supply circuitry to receive the second current; and a first output amplifier having an input connected to the second end of the collector to emitter path of the first transistor and an output for providing an output signal amplitude varying in proportion to the second current amplitude and varying inversely proportional to the oscillator frequency.

2. The variable frequency oscillator of claim 1 further comprising:

a second transistor having a collector to emitter path connected on a first end to the second output of the current supply circuitry to receive the second current, and having a base coupled to the output of the oscillator to receive the complement of the oscillator output signal; and a second output amplifier having an input connected to a second end of the collector to emitter path of the second transistor, and an output.

3. The variable frequency oscillator of claim 1, wherein the current supply comprises:

a current sink;

a second transistor having a collector to emitter path connecting the input of the oscillator to the current sink, and having a base connected to a voltage reference;

a third transistor having a collector to emitter path connected on a first end to the current sink, and having a base connected to the voltage reference;

a first resistor having a first terminal connected to a second end of the collector to emitter path of the third transistor and a second terminal connected to an upper voltage reference (V+);

an operational amplifier having a non-inverting input connected to the first terminal of the third transistor, an inverting terminal, and an output;

a second resistor having a first terminal connected to the inverting terminal of the operational amplifier and a second terminal connected to the upper voltage reference (V+); and a fourth transistor having a base connected to the output of the operational amplifier and a collector to emitter path connected to the first end of the collector to emitter path of the first transistor.

4. The variable frequency oscillator of claim 2 wherein the first and second output amplifiers are current amplifiers.

5. The variable frequency oscillator of claim 2 wherein the first and second output amplifiers are voltage amplifiers, and wherein the variable frequency oscillator further comprises:

a third resistor connecting the input of the first output amplifier to a lower voltage reference (V−); and a fourth resistor connecting the input of the second output amplifier to the lower voltage reference (V−).

6. A variable frequency oscillator comprising:

an oscillator having a input connected for receiving a first current, a first output for providing a signal having an frequency varying in proportion to the first current, and a second output for providing a signal which is a complement of the signal provided from the first oscillator output;

a first transistor having a base connected to the first output of the oscillator, an emitter and a collector;

a first output amplifier having an input connected to the collector of the first transistor, and an output;

a second transistor having a base connected to the second output of the oscillator, an emitter connected to the emitter of the first transistor, and a collector;

a second output amplifier having an input connected to the collector of the second transistor, and an output;

a current sink having a first end connected to a lower power supply (V−) and a second end;

a third transistor having a collector connected to the input of the oscillator, an emitter connected to the second end of the current sink, and a base connected to a voltage reference;

a fourth transistor having a collector, an emitter connected to the second end of the current sink, and a base connected to the voltage reference;

a first resistor having a first terminal connected to the collector of the fourth transistor and a second terminal connected to an upper power supply (V+);

an operational amplifier having a non-inverting input connected to the first terminal of the fourth transistor, an inverting terminal and an output;

a second resistor having a first terminal connected to the inverting terminal of the operational amplifier and a second terminal connected to the upper voltage reference (V+); and a fifth transistor having a base connected to the output of the operational amplifier, an emitter connected to the first terminal of the second resistor, and a collector connected to the emitters of the first and second transistors.

7. The variable frequency oscillator of claim 6 wherein the first and second output amplifiers are current amplifiers.

8. The variable frequency oscillator of claim 6 wherein the first and second output amplifiers are voltage amplifiers, and wherein the variable frequency oscillator further comprises:

a third resistor connecting the input of the first output amplifier to the lower voltage reference (V−); and a fourth resistor connecting the input of the second output amplifier to the lower voltage reference (V−).

* * * * *